United States Patent
Wu et al.

(10) Patent No.: US 8,378,716 B2
(45) Date of Patent: Feb. 19, 2013

(54) BULK-DRIVEN CURRENT-SENSE AMPLIFIER AND OPERATING METHOD THEREOF

(75) Inventors: Che-Wei Wu, Taichung (TW); Meng-Fan Chang, Taichung (TW); Ku-Feng Lin, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 4 days.

(21) Appl. No.: 13/178,698

(22) Filed: Jul. 8, 2011

(65) Prior Publication Data

US 2013/0009703 A1 Jan. 10, 2013

(51) Int. Cl.
*G01R 19/00* (2006.01)
(52) U.S. Cl. ............ 327/54; 327/56; 327/87; 365/210.1
(58) Field of Classification Search .................. 327/52, 327/54, 56, 68, 77, 85, 87, 89; 330/260, 330/290, 291, 296; 365/189.14, 189.15, 365/189.09, 207, 210.1, 210.12
See application file for complete search history.

(56) References Cited

U.S. PATENT DOCUMENTS

| | | | | |
|---|---|---|---|---|
| 4,802,138 A * | 1/1989 | Shimamune | ............. | 365/185.21 |
| 5,638,322 A * | 6/1997 | Lacey | ........................ | 365/185.2 |
| 5,856,748 A * | 1/1999 | Seo et al. | ......................... | 327/53 |
| 6,087,859 A * | 7/2000 | Lee et al. | ......................... | 327/51 |
| 6,362,661 B1 * | 3/2002 | Park | ................................. | 327/53 |
| 6,674,679 B1 * | 1/2004 | Perner et al. | .................. | 365/209 |
| 6,850,442 B2 * | 2/2005 | Tsai et al. | ................ | 365/185.21 |
| 7,312,641 B2 * | 12/2007 | Akaogi et al. | .................. | 327/51 |
| 7,825,733 B2 * | 11/2010 | Choi | ............................. | 330/296 |
| 8,018,253 B2 * | 9/2011 | Schreiber et al. | ............... | 327/55 |
| 2002/0030533 A1 * | 3/2002 | De et al. | ......................... | 327/534 |
| 2003/0198078 A1 * | 10/2003 | Baker | ........................... | 365/148 |

* cited by examiner

*Primary Examiner* — Lincoln Donovan
*Assistant Examiner* — Jung H Kim
(74) *Attorney, Agent, or Firm* — Muncy, Geissler, Olds & Lowe, PLLC

(57) ABSTRACT

A bulk-driven current-sense amplifier and an amplifier operating method are disclosed. The bulk-driven current-sense amplifier includes a differential amplifier, a first driver, and a second driver. The first driver is coupled to the differential amplifier, and a first node is formed at a connectivity segment of the first driver. The second drive is coupled to the differential amplifier, and a second node is formed at a connectivity segment of the second driver. When a first switch of the first driver and a second switch of the second driver are turned on, the differential amplifier charges the first node and the second node. When the charging is completed, the first node and the second node respectively have a different stabilized potential according to currents separately flowing through a first memory unit of the first driver and a second memory unit of the second drive, and the differential amplifier generates a voltage.

14 Claims, 6 Drawing Sheets

BULK-DRIVEN CURRENT-SENSE AMPLIFIER AND OPERATING METHOD THEREOF

FIELD OF THE INVENTION

The present invention relates to a sense amplifier applicable to non-volatile memory, and more particularly to a bulk-driven current-sense amplifier applicable to non-volatile memory and an operating method thereof, which enable increased rate of successful operation of the memory.

BACKGROUND OF THE INVENTION

Thanks to the progress in the scientific and technological fields, various kinds of electronic products have been developed, bringing more conveniences and comfortableness to people's daily life. Memory integrated circuits play a very important role in these electronic products. The currently available memory integrated circuits may be generally divided into two types, namely, volatile memory and non-volatile memory, according to their data storage characteristics.

The non-volatile memory can retain the stored data even when no power is supplied thereto. Among others, a resistive memory is one type of memory device that, after having written in data, would generate a voltage difference for storing the data as 0 or 1. Please refer to FIG. 1 that is a diagram of a resistive memory device. As shown, the $R_{CELL}$ is a main component in the resistive memory device and will switch to a low resistance state or a high resistance state after data is written thereinto. The low resistance is about 20K ohm, and the high resistance is usually higher than 2M ohm. In other words, in the high resistance state, the resistive memory device is almost in the open-circuit (OFF) state. To read the data, a bias voltage can be applied to a terminal of the $R_{CELL}$, and the current flowing through the $R_{CELL}$ is sensed by a sense amplifier to thereby read out the data. When operating under a normal voltage, the produced cell current is about 4 μA.

Please refer to FIG. 2 that is a diagram of a conventional current-sense amplifier. As shown, in the conventional current-sense amplifier, a P-type metal-oxide-semiconductor field-effect transistor (PMOSFET or PMOS) is connected to form a diode. That is, the drain and the gate of the PMOS are connected to each other. The transistor would have a stabilized gate voltage according to the current flowing therethrough. In this manner, a comparison current can be generated for comparing with the cell current. For example, in the resistive memory, when the current flowing through the transistor in the low resistance state is 4 μA and the current flowing through the transistor in the high resistance state is 0.2 μA, a current of 2 μA can be selected for use as the comparison current ($I_{REF}$). Since different currents have different stabilized voltages, a simple comparator can be used to compare the cell current with the comparison current and find out the value of data stored in the memory cell.

However, when the conventional current-sense amplifier operates, the required voltages $V_{MAT}$ and $V_{REF}$ must at least be $V_{DD}-V_{TH}-V_{OV}$. Under general manufacturing process, the PMOS has a VTH about 300 mV. In the case the operating voltage is 0.5V, then the voltages $V_{MAT}$ and $V_{REF}$ are only about 150 mV (i.e. $V_{DD}-V_{TR}-V_{OV}$=500 mV−300 mV−50 mV=150 mV). Therefore, the conventional current-sense amplifier tends to cause failed memory operation.

It is therefore tried by the inventor to develop a bulk-driven current-sense amplifier and an amplifier operating method capable of increasing the rate of successful operation of memory to meet the current market demands.

SUMMARY OF THE INVENTION

A primary object of the present invention is to provide a bulk-driven current-sense amplifier and an amplifier operating method, so as to improve the conventional current-sense amplifiers that, when operating normally, tend to cause memory operation failure.

To achieve the above and other objects, the bulk-driven current-sense amplifier according to an embodiment of the present invention includes a differential amplifier, a first driver, and a second driver. The differential amplifier includes a first voltage input terminal, a second voltage input terminal, and a voltage output terminal. The first driver includes a first transistor, a first switch, and a first memory unit. The first transistor has a drain coupled to a body of the first transistor and the first voltage input terminal of the differential amplifier to form a first node. The second driver includes a second transistor, a second switch, and a second memory unit. The second transistor has a drain coupled to a body of the second transistor and the second voltage input terminal of the differential amplifier to form a second node. When the first switch and the second switch are turned on, the differential amplifier charges the first and the second node. When the charging is completed, the first and second nodes have stabilized first and second potentials, respectively, according to the current flowing through the first and the second memory unit, and the differential amplifier generates a voltage output to the voltage output terminal.

In the above embodiment, the first and the second transistor are respectively a P-type metal-oxide-semiconductor field-effect transistor (PMOSFET or PMOS).

To achieve the above and other objects, the bulk-driven current-sense amplifier according to another embodiment of the present invention includes a differential amplifier, a first driver, and a second driver. The differential amplifier includes a first voltage input terminal and a second voltage input terminal. The first driver includes a first transistor, a first switch, and a first memory unit. Further, the first driver is coupled to the first voltage input terminal of the differential amplifier, so that a first node is formed at a connectivity segment of the first driver coupled to the first voltage input terminal. The second driver includes a second transistor, a second switch, and a second memory unit. Further, the second driver is coupled to the second voltage input terminal of the differential amplifier, so that a second node is formed at a connectivity segment of the second driver coupled to the second voltage input terminal. When the first and the second switch are turned on, the differential amplifier charges the first and the second node. When the charging is completed, the first and second nodes have different stabilized potentials according to the currents respectively flowing through the first and second memory units, and the differential amplifier generates a voltage.

To achieve the above and other objects, the amplifier operating method according to the present invention is applicable to a bulk-driven current-sense amplifier that includes a differential amplifier, a first driver, and a second driver. The first driver is coupled to the differential amplifier and a first node is formed at a connectivity segment of the first driver coupled to the differential amplifier; and the second driver is coupled to the differential amplifier and a second node is formed at a connectivity segment of the second driver coupled to the differential amplifier. The amplifier operating method according to the present invention includes the following steps: (1) When a first switch of the first driver and a second switch of the second driver are turned on, the differential amplifier charges the first and the second node; (2) when the charging is completed, the first and the second node have a first and a second potential, respectively, according to the currents flowing through a first memory unit of the first driver and a second memory unit of the second driver; and (3) the differential amplifier generates a voltage.

With the above arrangements, the bulk-driven current-sense amplifier and the amplifier operating method according to the present invention provide one or more of the following advantages:

(1) The differential amplifier has two voltage input terminals separately connected to the body and the drain of the two PMOS transistors. Due to the voltage VDS in the linear region and the Body Effect, the first and the second node, according to the currents flowing through the first and the second memory unit, can respectively have a stabilized voltage, which is higher than the conventional current-sense amplifier input stage; and (2) In the resistive memory cell as shown in FIG. 1, the higher the voltage at the BL is, the larger the cell current generated by the resistive memory cell will be, and the bulk-driven current-sense amplifier and the amplifier operating method according to the present invention can have a relatively wide range of read currents when operating at low voltage.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
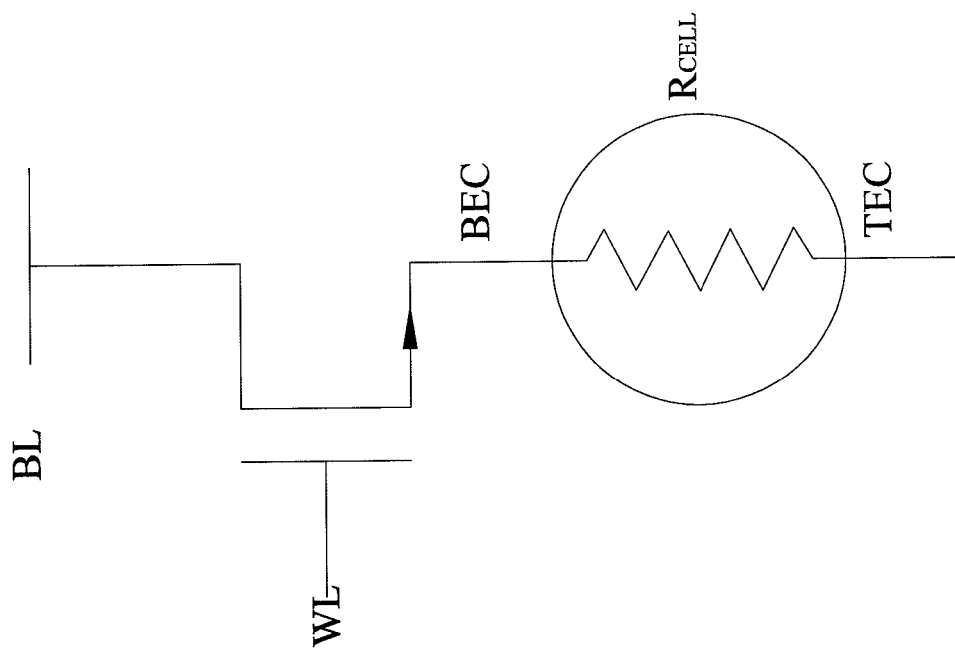
FIG. 1 is a diagram of a resistive memory device.
Figure 2:
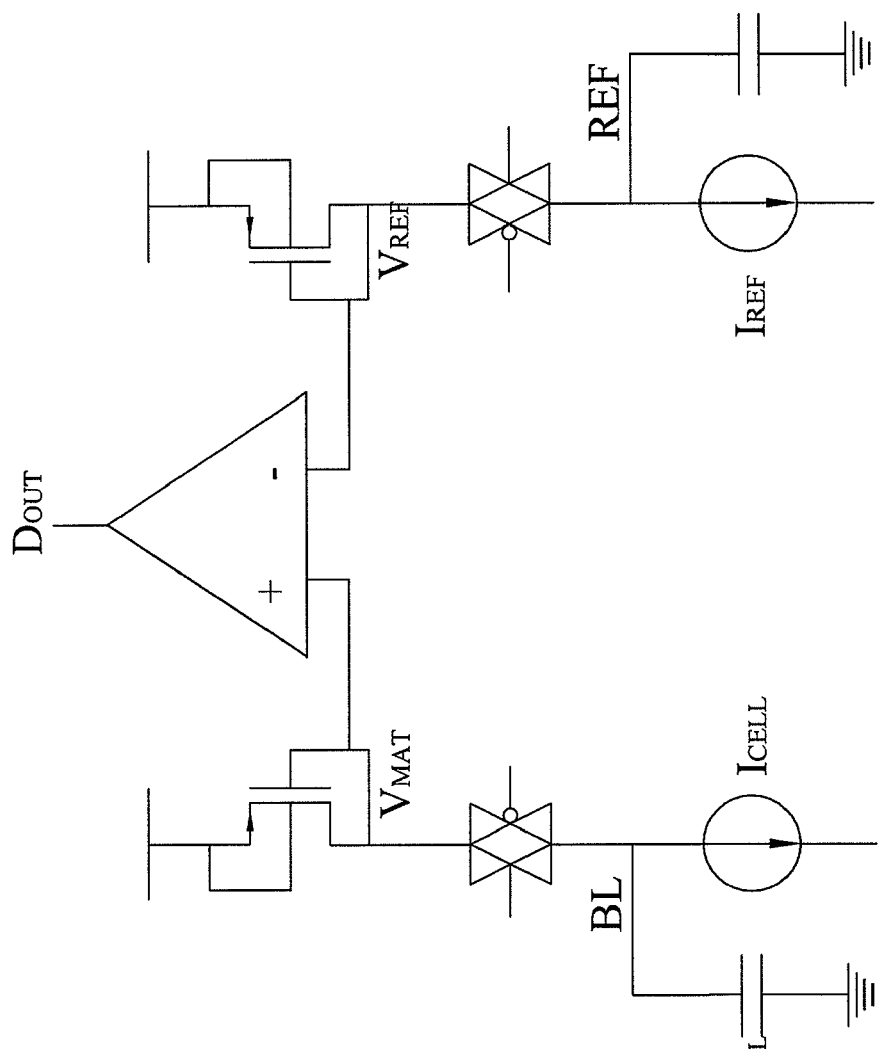
FIG. 2 is a diagram of a conventional current sense amplifier.

The present invention will now be described with some preferred embodiments thereof and with reference to the accompanying drawings. For the purpose of easy to understand, elements that are the same in the preferred embodiments are denoted by the same reference numerals.

Figure 3:
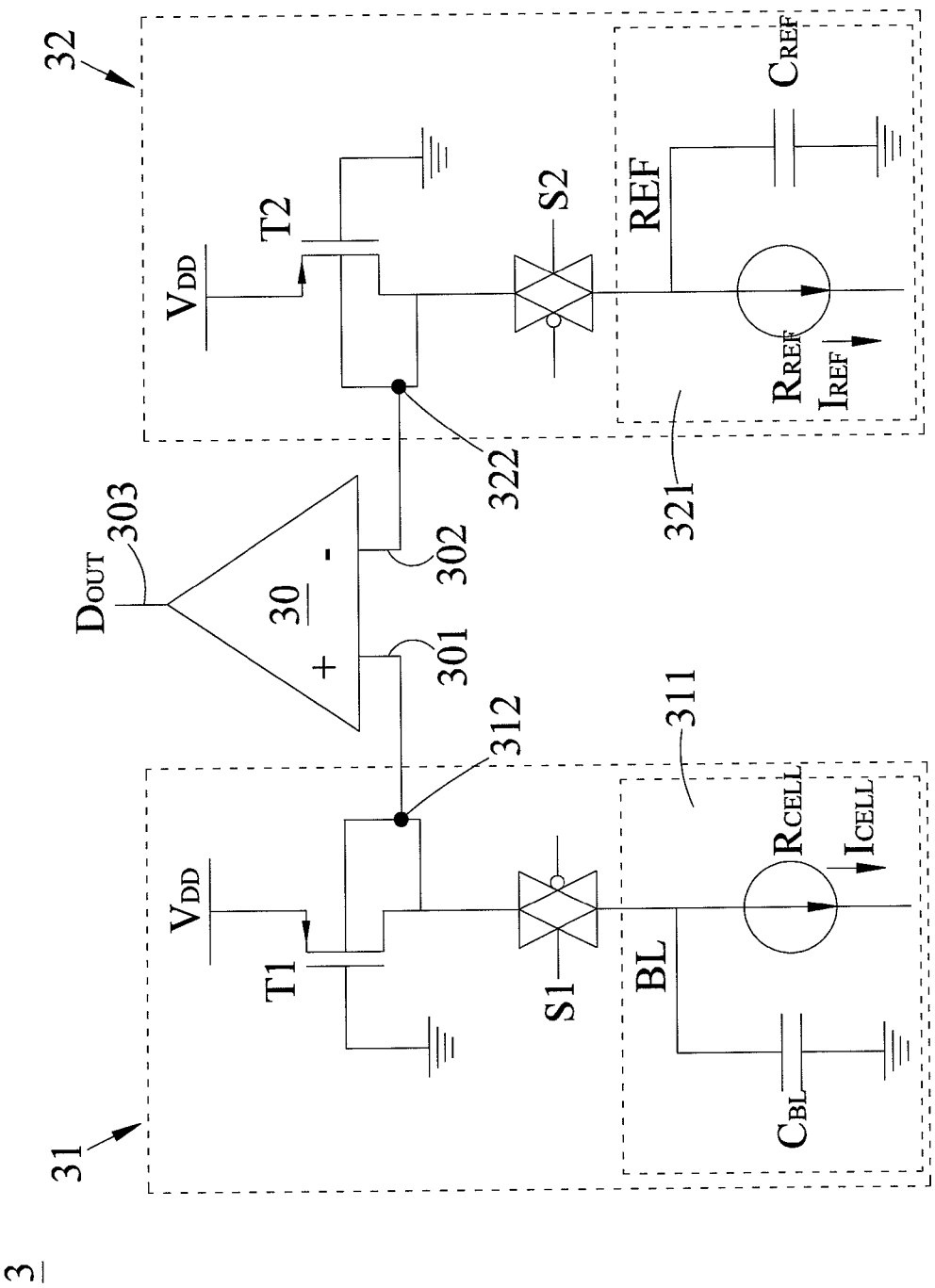
FIG. 3 is a circuit diagram of a bulk-driven current-sense amplifier according to an embodiment of the present invention.

Please refer to FIG. 3 that is a circuit diagram of a bulk-driven current-sense amplifier according to an embodiment of the present invention. As shown, the bulk-driven current-sense amplifier in the embodiment is generally denoted by reference numeral 3 and includes a differential amplifier 30, a first driver 31, and a second driver 32. The differential amplifier 30 has a first voltage input terminal 301, a second voltage input terminal 302, and a voltage output terminal 303. The first driver 31 includes a first transistor T1, a first switch S1, and a first memory unit 311. The first transistor T1 has a drain coupled to a body of the first transistor T1 and the first voltage input terminal 301 of the differential amplifier 30 to form a first node 312. The second driver 32 includes a second transistor T2, a second switch S2, and a second memory unit 321. The second transistor T2 has a drain coupled to a body of the second transistor T2 and the second voltage input terminal 302 of the differential amplifier 30 to form a second node 322. Further, the first and the second transistor T1, T2 are respectively a P-type Metal-Oxide-Semiconductor Field-Effect transistor (PMOSFET or PMOS).

The first memory unit 311 includes a first capacitor $C_{BL}$ and a first load $R_{CELL}$. The first load $R_{CELL}$ has an input terminal coupled to a terminal of the first capacitor $C_{BL}$ and a terminal of the first switch S1. The second memory unit 321 includes a second capacitor $C_{REF}$ and a second load $R_{REF}$. The second load $R_{REF}$ has an input terminal coupled to a terminal of the second capacitor $C_{REF}$ and a terminal of the second switch S2.

When the first switch S1 and the second switch S2 are turned on, the differential amplifier 30 charges the first node 312 and the second node 322. When the charging is completed, the first node 312 and the second node 322 have a stabilized first potential and a stabilized second potential, respectively, according to the current $I_{CELL}$ flowing through the first load $R_{CELL}$ and the current $I_{REF}$ flowing through the second load $R_{REF}$. When a voltage difference between the first potential and the second potential is larger than a preset value, the differential amplifier 30 generates a voltage $D_{OUT}$ output to the voltage output terminal 303.

Figure 4:
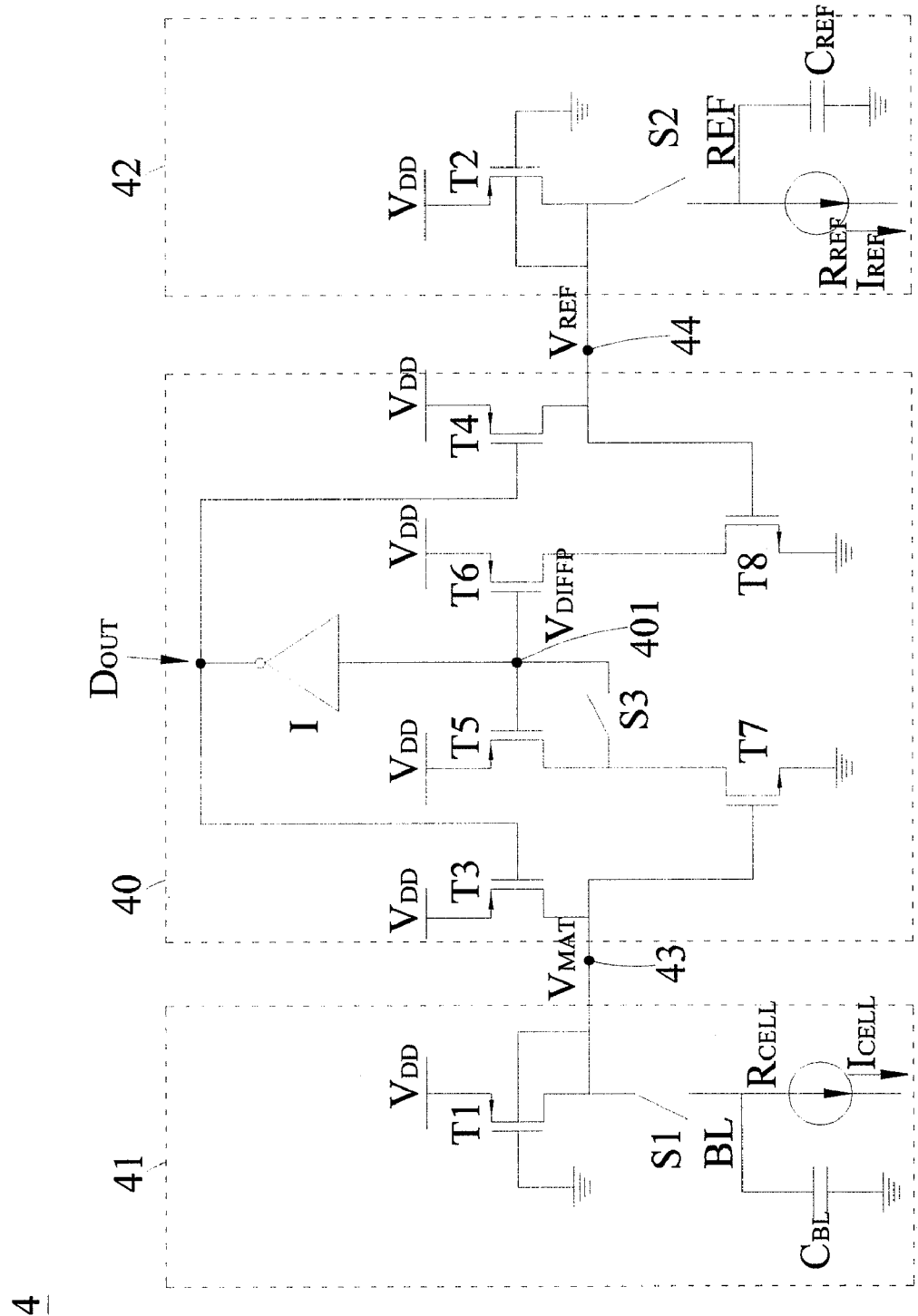
FIG. 4 is a circuit diagram of a bulk-driven current-sense amplifier according to an embodiment of the present invention showing a dynamically controlled charging thereof.

FIG. 4 is a circuit diagram of a bulk-driven current-sense amplifier according to an embodiment of the present invention showing a dynamically controlled charging thereof. As shown, the bulk-driven current-sense amplifier in the embodiment is denoted by reference numeral 4, and includes a differential amplifier 40, a first driver 41, and a second driver 42.

The first driver 41 includes a first transistor T1, a first switch S1, a first capacitor $C_{BL}$, and a first load $R_{CELL}$. In the embodiment, the first transistor T1 can be a PMOSFET or PMOS. The first transistor T1 has a drain coupled to a body of the first transistor T1 and a terminal of the first switch S1 to form a first node 43; a source coupled to a power source $V_{DD}$, which serves as a common terminal; and a gate coupled to a ground, which serves as a common terminal. The first load $R_{CELL}$ has an input terminal coupled to a terminal of the first capacitor $C_{BL}$ and another terminal of the first switch S1. The first capacitor $C_{BL}$ has another terminal coupled to the ground that serves as a common terminal.

The second driver 42 includes a second transistor T2, a second switch S2, a second capacitor $C_{REF}$, and a second load $R_{REF}$. In the embodiment, the second transistor T2 can be a PMOSFET or PMOS. The second transistor T2 has a drain coupled to a body of the second transistor T2 and a terminal of the second switch S2 to form a second node 44; a source coupled to the power source $V_{DD}$, which serves as a common terminal; and a gate coupled to the ground, which serves as a common terminal. The second load $R_{REF}$ has an input terminal coupled to a terminal of the second capacitor $C_{REF}$ and another terminal of the second switch S2. The second capacitor $C_{REF}$ has another terminal coupled to the ground that serves as a common terminal.

The differential amplifier 40 includes a third transistor T3, a fourth transistor T4, a fifth transistor T5, a sixth transistor T6, a seventh transistor T7, an eighth transistor T8, a third switch S3, and an inverter I. In the embodiment, the third, fourth, fifth and sixth transistors T3~T6 can respectively be a PMOSFET or PMOS, while the seventh and eighth transistors T7, T8 can respectively be an N-type Metal-Oxide-Semiconductor Field-Effect transistor (NMOSFET or NMOS). The third to the sixth transistor T3~T6 respectively have a source coupled to the power source $V_{DD}$ that serves as a common terminal; and the seventh and the eighth transistor T7, T8 respectively have a source coupled to the ground that serves as a common terminal.

The third transistor T3 has a drain and the seventh transistor T7 has a gate, which are coupled to the first node 43. The fourth transistor T4 has a drain and the eighth transistor T8 has a gate, which are coupled to the second node 44. The third and the fourth transistor T3, T4 respectively have a gate coupled to a current output terminal of the inverter I. The fifth transistor T5 has a drain coupled to a terminal of the third switch S3 and a drain of the seventh transistor T7. The sixth transistor T6 has a drain coupled to a drain of the eighth transistor T8. A gate of the fifth transistor T5, a gate of the sixth transistor T6, another terminal of the third switch S3, and a current input terminal of the inverter I are coupled to one another to form a third node 401.

Figure 5:
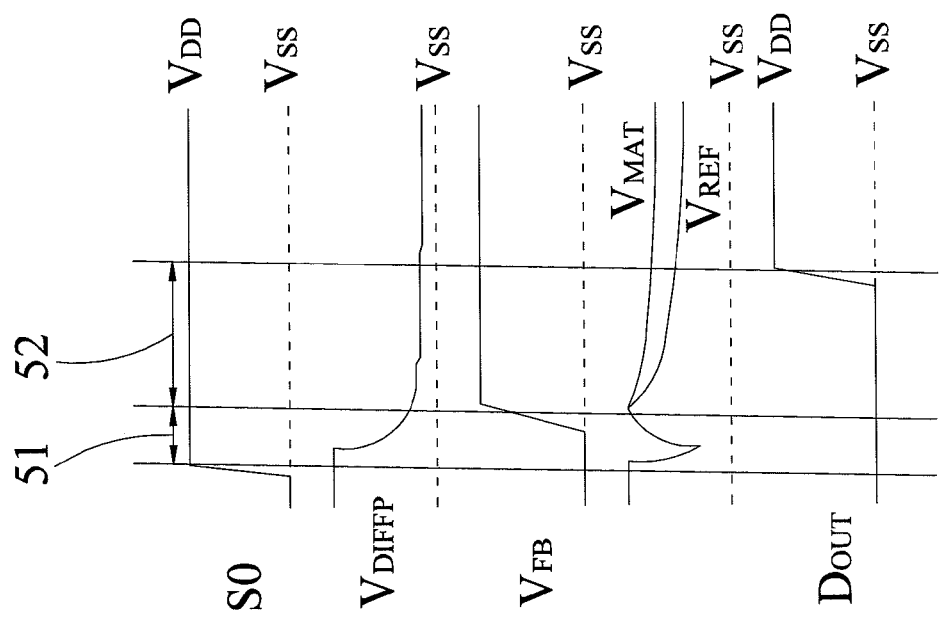
FIG. 5 is a waveform diagram according to an embodiment of the bulk-driven current-sense amplifier of the present invention.

Please refer to FIG. 5 that is a waveform diagram according to an embodiment of the bulk-driven current-sense amplifier of the present invention. As shown, in the illustrated embodiment, the bulk-driven current-sense amplifier has operating steps divided into two stages 51 and 52.

The first stage 51 is a dynamically controlled charging stage.

In the first stage 51, when the first switch S1, the second switch S2 and the third switch S3 are turned on, an initial potential at BL is zero, which causes drop of voltages $V_{MAT}$ and $V_{REF}$. By extending the time during which the third and the fourth transistors (PMOS) T3, T4 are kept to ON, the $V_{MAT}$ and $V_{REF}$ can be charged. Moreover, the ending of the charge time is controlled by the differential amplifier. When the differential amplifier operates, $V_{DIFFP}$ will drop, and the inverter I is connected to the gate voltage of the third and the fourth transistor T3, T4 again to thereby turn off the third and the fourth transistor T3, T4. Thus, the third and the fourth transistor (PMOS) T3, T4 will stop charging.

The second stage 52 is a reading stage.

When the dynamically controlled charging stage 51 is ended, $V_{MAT}$ and $V_{REF}$ respectively have a potential close to that of $V_{DD}$, but then respectively have a stabilized voltage according to the current $I_{CELL}$ flowing through the first load $R_{CELL}$ and the current $I_{REF}$ flowing through the second load $R_{REF}$. When a voltage difference between the $V_{MAT}$ and the $V_{REF}$ is large enough for the differential amplifier to generate a voltage $D_{OUT}$ output to the output terminal thereof, the reading stage is ended. For example, when the $D_{ODT}$ is changed from zero to $V_{DD}$, it represents the data being read is 1.

Although the active components illustrated in the circuits of the embodiments of the present invention are P-type or N-type transistors, one of ordinary skill in the art understands that the active components in the circuits of the present invention can be otherwise bipolar transistors or different combinations of bipolar transistors and field-effect transistors. It is noted the above embodiments are only illustrative and not intended to limit the present invention in any way.

While the above description of the bulk-driven current-sense amplifier of the present invention has also introduced a concept about the operating method of the bulk-driven current-sense amplifier, a flowchart showing more detailed steps of an amplifier operating method according to the present invention is nevertheless provided herein for the purpose of clarity.

Figure 6:
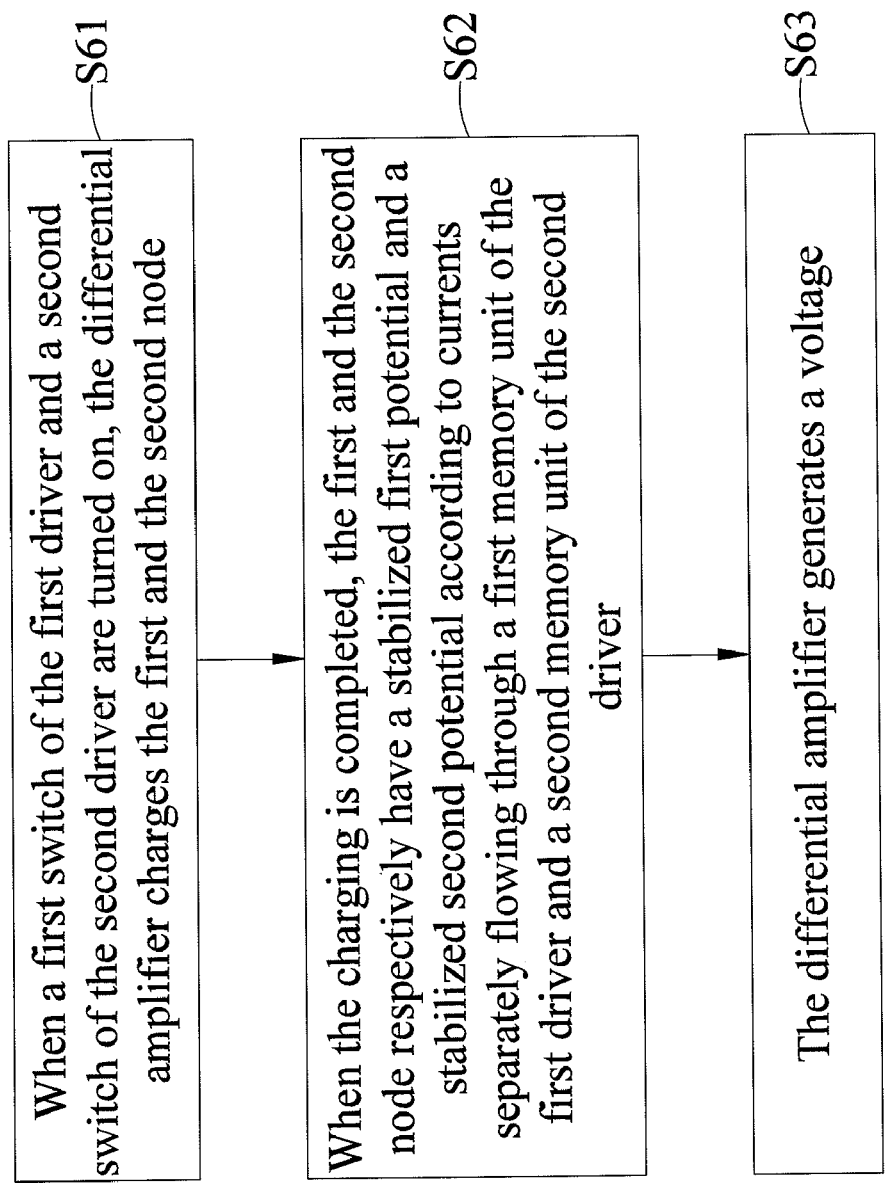
FIG. 6 is a flowchart showing the steps included in an amplifier operating method according to the present invention.

Please refer to FIG. 6 that is a flowchart showing the steps included in the amplifier operating method according to the present invention. As shown, the operating method is applicable to a bulk-driven current-sense amplifier that includes a differential amplifier, a first driver, and a second driver. The first driver is coupled to the differential amplifier, and a first node is formed at a connectivity segment of the first driver coupled to the differential amplifier. Similarly, the second driver is coupled to the differential amplifier, and a second node is formed at a connectivity segment of the second driver coupled to the differential amplifier. The amplifier operating method includes the following steps S61, S62 and S63.

In the step S61, when a first switch included in the first driver and a second switch included in the second driver are turned on, the differential amplifier charges the first node and the second node.

In the step S62, when the charging is completed, the first node and the second node have a stabilized first potential and a stabilized second potential, respectively, according to the current flowing through a first memory unit included in the first driver and the current flowing through a second memory unit included in the second driver.

In the step S63, the differential amplifier generates a voltage.

Since the details and the implementation of the amplifier operating method of the present invention have already been recited in the above description of the bulk-driven current-sense amplifier of the present invention, they are not repeatedly discussed herein.

In conclusion, with the bulk-driven current-sense amplifier and the amplifier operating method according to the present invention, the differential amplifier has two voltage input terminals separately connected to the body and the drain of two PMOS transistors. Due to the voltage VDS in the linear region and the Body Effect, $V_{MAT}$ and $V_{REF}$ can have stabilized voltages according to the currents flowing through the first and the second memory unit. Under this condition, only one voltage $V_{DS}$ is needed. Therefore, the required voltages for $V_{MAT}$ and $V_{REF}$ are $V_{DD}$-$V_{ov}$. In the case the $V_{DD}$ is 0.5V, the voltages $V_{MAT}$ and $V_{REF}$ are respectively about 350 mV, which is higher than the conventional current-sense amplifier input stage.

In addition, in the resistive memory cell, since the voltage at the BL is the same as the voltage $V_{MAT}$ during data reading, and the higher the voltage at the BL is, the larger the cell current generated by the resistive memory cell will be, the bulk-driven current-sense amplifier and the amplifier operating method according to the present invention can have a relatively large range of read currents when operating at low voltage.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A bulk-driven current-sense amplifier, comprising:
    a differential amplifier having a first voltage input terminal, a second voltage input terminal, and a voltage output terminal;
    a first driver including a first transistor, a first switch, and a first memory unit; the first transistor having a drain coupled to a body of the first transistor and the first voltage input terminal of the differential amplifier to form a first node; and a second driver including a second transistor, a second switch, and a second memory unit; the second transistor having a drain coupled to a body of the second transistor and the second voltage input terminal of the differential amplifier to form a second node, wherein the first and the second transistors are P-type metal-oxide-semiconductor field-effect transistors; and wherein when the first switch and the second switch are turned on, the differential amplifier charges the first and the second node; and when the charging is completed, the first and the second node have a stabilized first potential and a stabilized second potential, respectively, according to currents flowing through the first and the second memory unit, and the differential amplifier generates a voltage output to the voltage output terminal.

2. The bulk-driven current-sense amplifier as claimed in claim 1, wherein the differential amplifier further includes:
an inverter;
a third transistor having a gate coupled to an output terminal of the inverter and a drain coupled to the first node; and
a fourth transistor having a gate coupled to the output terminal of the inverter and a drain coupled to the second node.

3. The bulk-driven current-sense amplifier as claimed in claim 2, wherein, when the first switch and the second switch are turned on, the third and the fourth transistor charge the first node and the second node, respectively.

4. The bulk-driven current-sense amplifier as claimed in claim 2, wherein the differential amplifier controls charge time via the inverter.

5. The bulk-driven current-sense amplifier as claimed in claim 1, wherein the first memory unit further includes a first capacitor and a first load, and the first load having an input terminal coupled to a terminal of the first capacitor and a terminal of the first switch; and the second memory unit further includes a second capacitor and a second load, and the second load having an input terminal coupled to a terminal of the second capacitor and a terminal of the second switch.

6. The bulk-driven current-sense amplifier as claimed in claim 1, wherein, when a difference between the first potential and the second potential is larger than a preset value, the differential amplifier generates the voltage output to the voltage output terminal.

7. The bulk-driven current-sense amplifier as claimed in claim 2, wherein the third and the fourth transistors are P-type metal-oxide-semiconductor field-effect transistors.

8. A bulk-driven current-sense amplifier, comprising:
a differential amplifier having a first voltage input terminal and a second voltage input terminal;
a first driver including a first transistor, a first switch, and a first memory unit; the first driver being coupled to the first voltage input terminal of the differential amplifier, and a first node being formed at a connectivity segment of the first driver coupled to the first voltage input terminal; and
a second driver including a second transistor, a second switch, and a second memory unit; the second driver being coupled to the second voltage input terminal of the differential amplifier, and a second node being formed at a connectivity segment of the second driver coupled to the second voltage input terminal, wherein the first and the second transistors are P-type metal-oxide-semiconductor field-effect transistors and respectively have a drain coupled to a body thereof for stabilizing potentials of the first and the second nodes;

wherein when the first switch and the second switch are turned on, the differential amplifier charges the first and the second node; and when the charging is completed, the first and the second node respectively have a different stabilized potential according to currents flowing through the first and the second memory unit, and the differential amplifier generates a voltage.

9. The bulk-driven current-sense amplifier as claimed in claim 8, wherein the differential amplifier further includes a third and a fourth transistor for charging the first and the second node, respectively.

10. The bulk-driven current-sense amplifier as claimed in claim 8, wherein the differential amplifier further includes an inverter for controlling charge time.

11. An amplifier operating method, being applicable to a bulk-driven current-sense amplifier that includes a differential amplifier, a first driver, and a second driver; the first driver being coupled to the differential amplifier so that a first node is formed at a connectivity segment of the first driver coupled to the differential amplifier; the second driver being coupled to the differential amplifier so that a second node is formed at a connectivity segment of the second driver coupled to the differential amplifier, wherein the first and the second drivers include a first and a second transistor, respectively; and the first and the second transistors are P-type metal-oxide-semiconductor field-effect transistors; the amplifier operating method comprising the following steps:
the differential amplifier charging the first and the second node when a first switch of the first driver and a second switch of the second driver are turned on;
after completion of charging the first and the second node, the first and the second node having a stabilized first potential and a stabilized second potential by coupling a drain to a body thereof, respectively, according to currents separately flowing through a first memory unit of the first driver and a second memory unit of the second driver; and
the differential amplifier generating a voltage.

12. The amplifier operating method as claimed in claim 11, further comprising the following step: a third and a fourth transistor of the differential amplifier charging the first and the second node, respectively, when the first switch of the first driver and the second switch of the second driver are turned on.

13. The amplifier operating method as claimed in claim 11, further comprising the following step: the differential amplifier controlling charge time via an inverter thereof.

14. The amplifier operating method as claimed in claim 11, further comprising the following step: the differential amplifier generating the voltage when a difference between the first potential and the second potential is larger than a preset value.

* * * * *